United States Patent [19]

Gruodis et al.

[11] Patent Number: 4,779,270
[45] Date of Patent: Oct. 18, 1988

[54] APPARATUS FOR REDUCING AND MAINTAINING CONSTANT OVERSHOOT IN A HIGH SPEED DRIVER

[75] Inventors: Algirdas J. Gruodis, Wappingers Falls; Dale E. Hoffman, Stormville; Charles A. Puntar, Hopewell Junction; Daniel E. Skooglund, Beacon, all of N.Y.

[73] Assignee: International Business Machines Corporation, Armonk, N.Y.

[21] Appl. No.: 40,384

[22] Filed: Apr. 15, 1987

[51] Int. Cl.$^4$ .................. H03K 3/01; H03K 17/16; H03K 19/086
[52] U.S. Cl. .................. 307/270; 307/443; 307/455; 307/264
[58] Field of Search ............ 307/443, 454, 455, 264, 307/270

[56] References Cited

U.S. PATENT DOCUMENTS

| | | | |
|---|---|---|---|
| 3,519,810 | 7/1970 | Priel | 235/176 |
| 3,925,691 | 12/1975 | Gaskill | 307/300 |
| 3,955,099 | 5/1976 | Gaskill | 307/218 |
| 4,215,418 | 7/1980 | Muramatsn | 364/754 |
| 4,228,369 | 10/1980 | Anatha | 307/270 |
| 4,276,485 | 6/1981 | Rydval | 307/463 |
| 4,311,925 | 1/1982 | Chang | 307/455 |
| 4,349,750 | 9/1982 | Geurts | 307/243 |
| 4,613,771 | 9/1986 | Gal | 307/443 |
| 4,651,033 | 3/1987 | Yasutake et al. | 307/355 |

FOREIGN PATENT DOCUMENTS 0205825  11/1984  Japan ................ 307/454

OTHER PUBLICATIONS

"High Speed Comparator Circuit", Chang, I.B.M. Tech. Dis. Bul., vol. 27, No. 4A, 9/84.

Primary Examiner—John Zazworsky
Assistant Examiner—M. R. Wambach
Attorney, Agent, or Firm—Alexander Tognino; Wesley DeBruin

[57] ABSTRACT

Disclosed is a method and circuit for reducing and maintaining constant overshoot in a high speed driver. The circuit includes a predriver circuit which is driven single endedly and a driver circuit which is differentially driven by the predriver outputs. The predriver and the driver are differential pairs, with commonly controlled individual transistor current sources. A diode has been added in series with each emitter of the differential pairs. Schottky diodes are preferable because of their low capacitance. The diodes increase the input switching voltage (the smallest input voltage swing that will cause the outputs to fully switch) of the differential pair because they must also be switched on and off. The increase results in an increase in effective transition time, which results in smaller overshoots because the circuit is being switched slower. The output amplitude of the driver is set by a voltage which controls the current source currents of the commonly controlled current sources. As the amplitude is decreased the input switching voltage decreases because the current through the devices decreases which results in smaller base-emitter and diode voltages. Due to the commonly controlled current sources, the predriver amplitude decreases as the driver amplitude decreases. The predriver is designed such that its variable output supplies the driver with the proper input switching voltage at any driver amplitude. This keeps the effective input transition time constant which results in constant output overshoot.

3 Claims, 7 Drawing Sheets

PREDRIVER / DRIVER CIRCUIT

CONVENTIONAL DRIVER CIRCUIT

FIG. 8 PREDRIVER / DRIVER CIRCUIT

APPARATUS FOR REDUCING AND MAINTAINING CONSTANT OVERSHOOT IN A HIGH SPEED DRIVER

BACKGROUND OF THE INVENTION

1. Field of the Invention

The invention relates to high speed driver circuits. More particularly the invention relates to a digital driver circuit of known fixed output impedance, with variable output amplitude, with fast transitions between two binary states, and at the same time keeps the overshoot of the driver output to a minimum for all amplitudes.

2. Prior Art

Numerous driver circuits are known to the prior art. One conventional circuit utilizes a differential pair of transistors which may be driven by a flip-flop. Variable amplitude is achieved by changing the current in the current source. This is done by varying the current source base voltage. Transition time and overshoot/undershoot characteristics for drivers of this type do not meet the demands of more sophisticated high electronic equipment, such as test systems for integrated circuit logic and array chips.

3. Background Art

The following patents are directed to driver circuits and various current switch circuits with current sources. It is to be appreciated that the following art is not necessarily the only, the best, or the most pertinent art.

U.S. Pat. No. 3,519,810 entitled "Logic Element (Full Adder) Using Transistor Tree-Like Configurations" granted July 7, 1970 to U. Priel et al.

U.S. Pat. No. 3,925,691 entitled "Cascode Node Idle Current Injection Means" granted Dec. 9, 1975 to J. Gaskill, Jr. et al.

U.S. Pat. No. 3,955,099 entitled "Diode Controlled Idle Current Injection" granted May 4, 1976 to J. Gaskill, Jr. et al.

U.S. Pat. No. 4,215,418 entitled "Integrated Digital Multiplier Circuit Using Current Mode Logic" granted July 29, 1980 to J. Maramatsn.

U.S. Pat. No. 4,228,369 entitled "Integrated Circuit Interconnection Structure Having Precision Terminating Resistors" granted Oct. 14, 1980 to N. Anantha et al.

U.S. Pat. No. 4,276,485 entitled "Monolithic Digital Semiconductors Circuit Comprising a Plurality of Bipolar Transistors" granted June 30, 1981 to P. Rydval.

U.S. Pat. No. 4,311,925 entitled "Current Switch Emitter Follower Latch Having Output Signals With Reduced Noise" granted Jan. 19, 1982 to A. Chang et al.

U.S. Pat. No. 4,349,750 entitled "Switching Circuit Comprising A Plurality of Input Channels And An Output Channel" granted Sept. 14, 1982 to M. Geurts.

U.S. Pat. No. 4,408,134 entitled "Unitary Exclusive Or-And Logic Circuit" granted Oct. 4, 1983 to M. Allen.

SUMMARY OF THE INVENTION

A primary object of the invention is to provide an improved high speed driver circuit.

A further object of the invention is to provide a high speed driver circuit having an output whose overshoot is reduced and relatively constant.

A further object of the invention is to provide a high speed driver circuit having particular utility in a high performance test system for integrated circuit devices.

A yet further object of the invention is to provide a high speed driver circuit for a high performance array test system which for example requires logic outputs with variable amplitude from 0.5 Volts to 1.3 Volts peak to peak, variable baseline from −2 Volts, to 1 Volts, 400 picosecond transitions and overshoot/undershoot less than 100 millivolts.

A still further object of the invention is to provide an improved driver circuit for supplying signals which are used as stimulus for the device under test in a high performance test system.

The invention is a method and circuit for reducing and maintaining constant overshoot in a high speed driver. The circuit includes a predriver circuit which is driven single endedly and a driver circuit which is differentially driven by the predriver outputs. The predriver and the driver are differential pairs, with commonly controlled individual transistor current sources. A diode has been added in series with each emitter of the differential pairs. Schottky diodes are preferable because of their low capacitance. The diodes increase the input switching voltage (the smallest input voltage swing that will cause the outputs to fully switch) of the differential pair because they must also be switched on and off. This increase results in an increase in effective transition time, which results in smaller overshoots because the circuit is being switched slower. The output amplitude of the driver is set by a voltage which controls the current source currents of the commonly controlled current sources.

The predriver circuit decreases the driver input amplitude as the output amplitude decreases since both current sources are controlled by the same voltage. This compensates for the decrease in driver input switching voltage and keeps the effective transition time constant. (The driver input switching voltage decreases with decreasing amplitude because the base-emitter and diode voltage drops get smaller). The output overshoot remains constant because the effective transition time does not change. The relationship between input and output amplitudes is determined from the dc transfer curves and can be approximated with small error as a linear relationship.

These and other objects, features and advantages of the invention will be apparent from the following more particular description of the preferred embodiments of the invention as illustrated in the drawings.

BRIEF DESCRIPTION OF THE DRAWINGS

FIG. 3, comprised of FIGS. 3A, 3B, 3C and 3D, discloses voltage and current waveforms, showing "glitches" for the overdriven circuit of FIG. 1.

DETAILED DESCRIPTION

Figure 1:
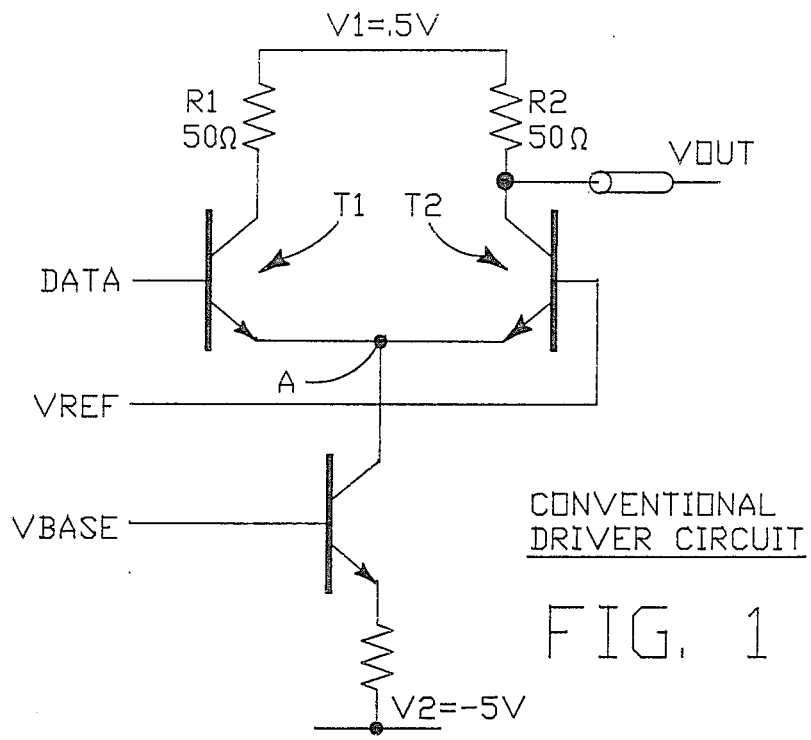
FIG. 1 discloses a circuit diagram of a known, or conventional, driver circuit.

The invention for ease of understanding and convenience of explanation will be disclosed and described as a embodiment having particular utility in an integrated circuit device test system. However, it will be apparent to persons skilled in art that our invention may be employed advantageously in various applications. Further, in the disclosed embodiment parameters, such as, voltage and current are interchangeable depending on which is desired to be monitored and parameter values, such as resistor values, voltage magnitudes, current magnitudes, etc. are set forth solely for illustrative and explanatory purposes. Our invention is not to construct as limited to particular parameters such as the particular voltage, resistor and current values set-forth hereinafter and shown in the drawings.

TECHNICAL PROBLEM ADDRESSED

A high performance array test system requires logic outputs with variable amplitude from 0.5 Volts to 1.3 Volts peak-peak, variable baseline from −2 Volts to +1 Volts, 400 ps transitions and overshoot/undershoot less than 100 mv. The driver circuits supply these signals which are used as stimulus for the Device Under Test (DUT).

EXISTING APPROACH TO THE PROBLEM

As shown in FIG. 1 a conventional driver circuit includes a differential pair driven by a flip-flop used for data formatting. Variable amplitude is achieved by changing the current in the current source. This is done by varying the current source base voltage. Typical transition times and overshoot/undershoot for this driver are 1 ns and 50 mv respectively.

DESCRIPTION OF SOLUTION

Figure 2:
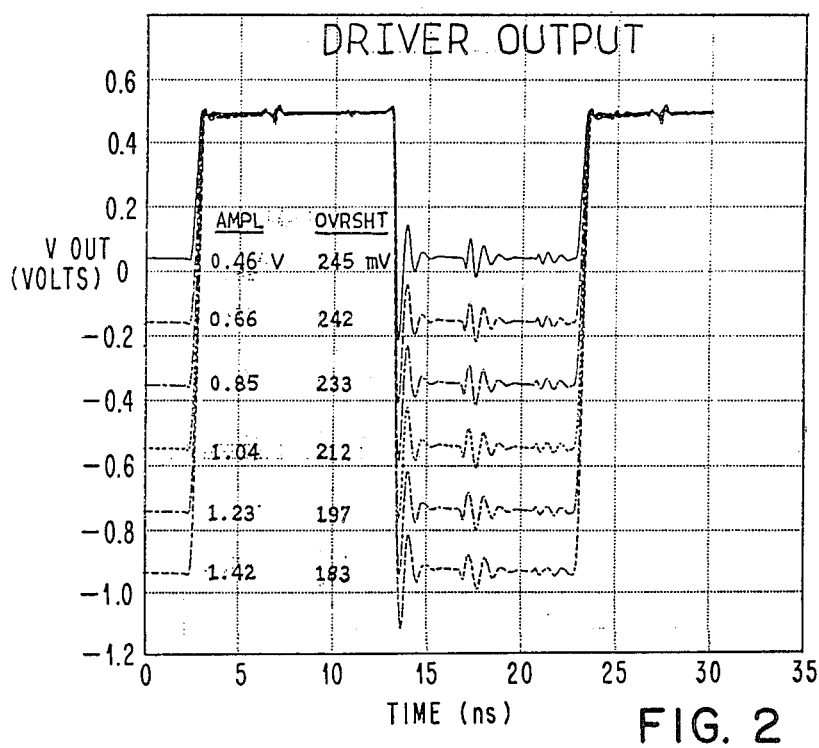
FIG. 2 discloses the output waveforms of an improved conventional driver circuit of the type shown in FIG. 1. The waveforms depict output voltage and overshoot voltage versus time.

To achieve the transition time specification, the transistors in the conventional driver of FIG. 1 (Ft=4.0 Ghz) are replaced with faster devices (Ft=8.0 Ghz) and the driver is switched differentially. FIG. 2 shows the transient performance for this circuit at six different amplitudes. These results show that transition time is within the specification, but overshoot is larger than the specification and increases with decreasing amplitude. The overshoot results are explained below. When switching occurs, the common emitter node (A, G=FIG. 1) drops, FIG. 3A following the device T1 turning off. As the other device T2 turns on, its emitter current charges the common emitter node capacitance and pulls the common emitter node A back up. If the input transition is faster than the transistor can respond to, an emitter current spike FIG. 3B results in the charging of the common emitter node. This creates a collector current spike, FIG. 3C, which results in an output voltage overshoot, FIG. 3D.

Figure 3A:
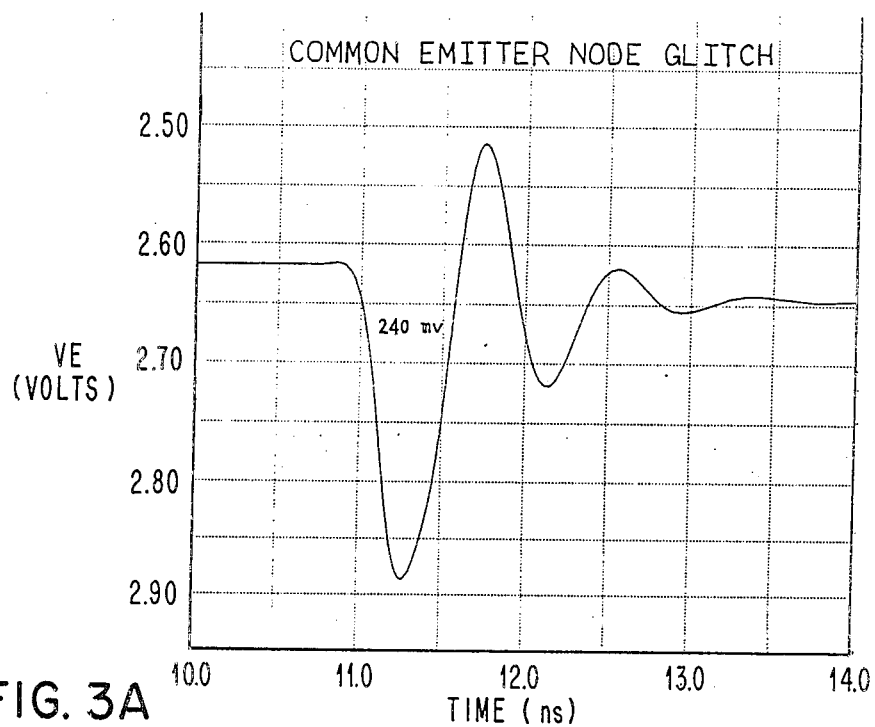
FIG. 3A illustrates the common emitter glitch of transistors T1 and T2 of FIG. 1.

FIG. 3A shows the common emitter node A falling as transistor T1 turns off and then rising as transistor T2 turns on. The node then settles after the transition has occurred.

Figure 3B:
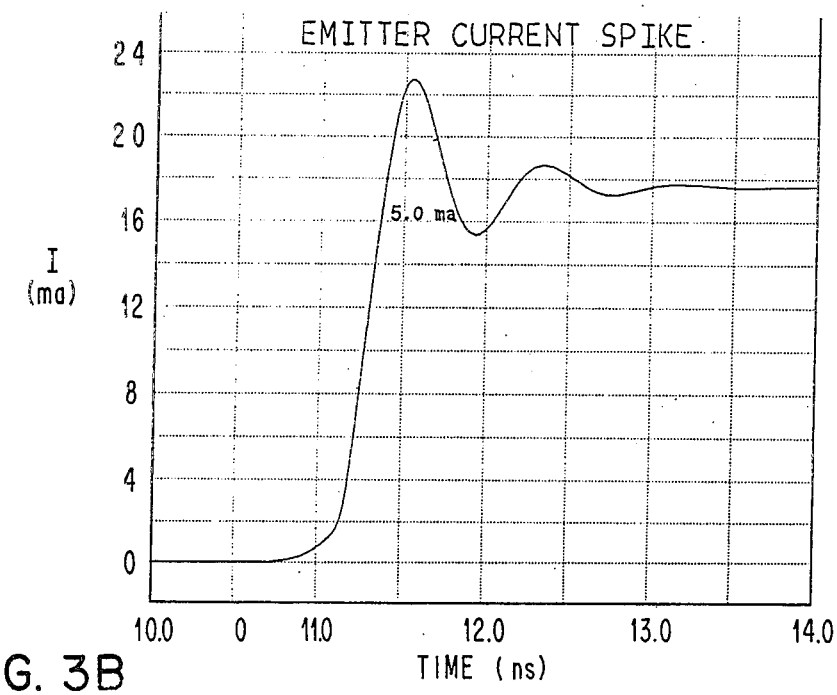
FIG. 3B illustrates the emitter current spike of transistor T2 of FIG. 1.

FIG. 3B shows the emitter current of transistor T2 as T2 turns on. Initially, the current overshoots because the transistor cannot respond to the fast input transition. In other words, the circuit is unstable (underdamped) at the high frequencies contained in the fast transition time.

Figure 3C:
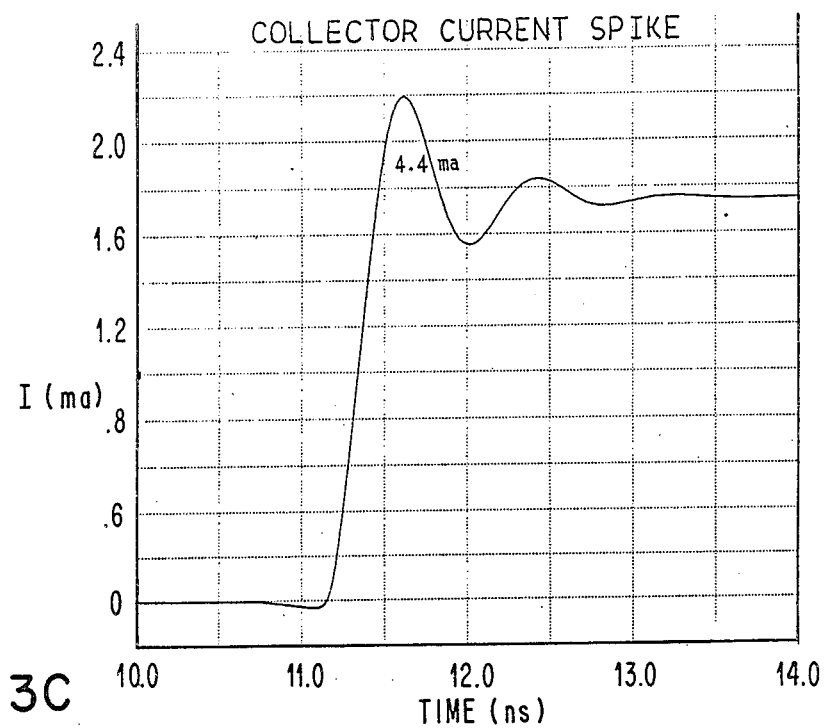
FIG. 3C illustrates the collector current spike of transistor T2 of FIG. 1.

FIG. 3C shows the collector current of T2 as it turns on. The overshoot in this current is caused by the emitter current.

Figure 3D:
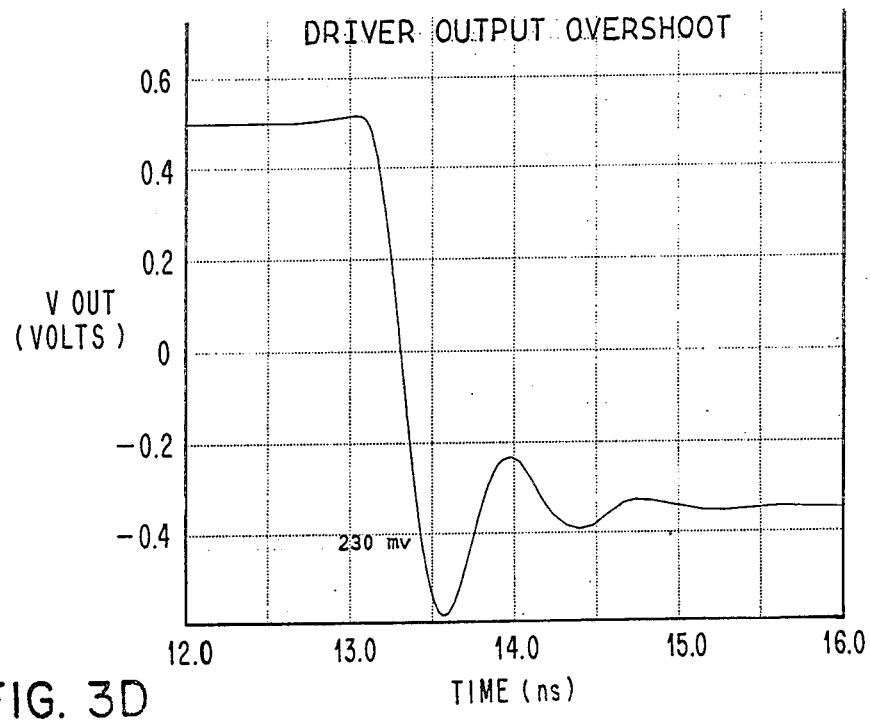
FIG. 3D illustrates the driver output overshoot of the driver of FIG. 1.

FIG. 3D shows the collector voltage of T2 as it turns on. This is the voltage drop across the collector resistor and; thus, is an inversion of the shape of the collector current.

The overshoot increases as the amplitude decreases because the driver input switching voltage decreases while the input amplitude remains constant. This will be explained in three parts. First, input switching voltage will be defined and its relationship to amplitude will be given. Second, effective transition time will be defined and its relationship to input switching voltage will be given. Third, the relationship between effective transition time and overshoot will be given.

Figure 4:
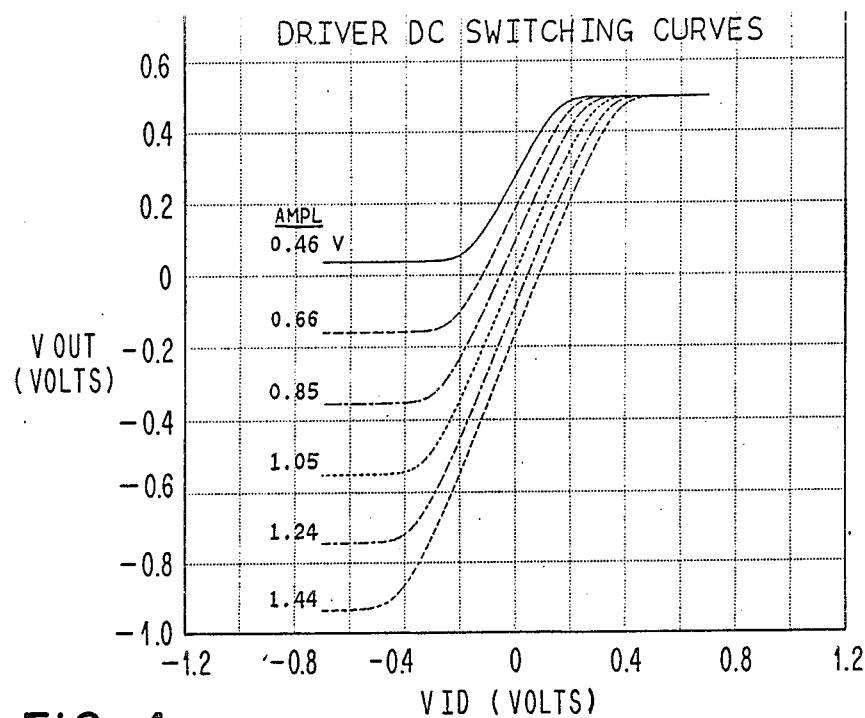
FIG. 4 illustrates driver DC switching for an improved conventional driver of the type shown in FIG. 1.

The driver input switching voltage (ISV) is the smallest input swing that will cause the output to fully switch from one level to the other. Referring to FIG. 4, the input switching voltage is the voltage along the horizontal axis starting at the lower knee of each curve and ending at the upper knee. FIG. 4 is a plot of the dc relationship between the input difference voltage, $V_{id}$ ($V_{id}$ is the difference between the input and the reference voltage.) and the output voltage for six different output amplitudes. As seen in this figure, the ISV decreases as the amplitude decreases. This occurs because the collector currents in the switching transistors T1 and T2 are decreasing which lowers the base to emitter voltages. Because the base to emitter voltages are lower, less of an input swing is needed to turn these transistors on and off.

Figure 5:
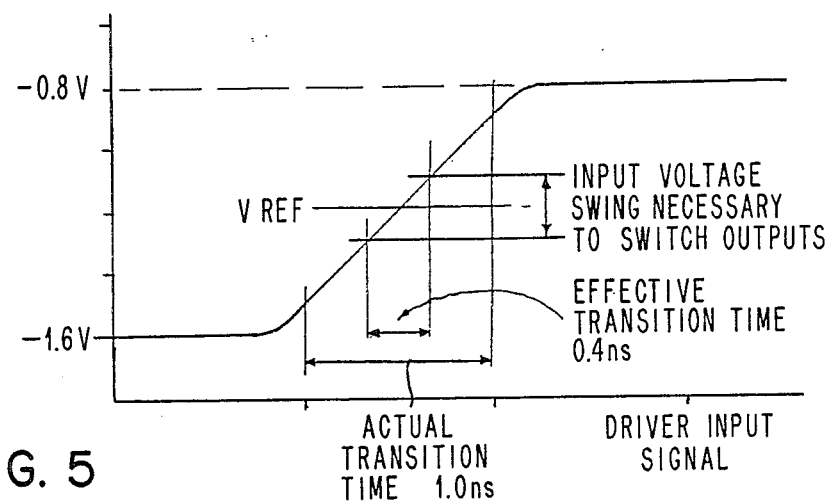
FIG. 5 is a plot of input voltage versus time employed to illustrate "effective" transition time.

The driver is designed such that the input swing is large enough to fully switch the output for all amplitudes required. Since the input swing is always larger than the ISV, the transistor switching takes place during only part of the input transition. This part is centered about the reference voltage and is equal to the ISV. FIG. 5 shows the input transition and the reference voltage and how the switching is centered about the reference. When $V_{id}$ equals zero or when the input is equal to the reference, both transistors have equal $V_{be}$s and equal collector currents which are equal to one half the current source current. Thus, the output is in the middle of the output levels. As $V_{id}$ increases above zero, $V_{be1}$ increases and $V_{be2}$ decreases until T1 is conducting all the current source current and T2 is off. At this point the output is at the low level and further increases in $V_{id}$ show up as decreases in $V_{be2}$ to the point of reverse bias and eventually base emitter reverse breakdown. As $V_{id}$ decreases below zero, the previous situation occurs with T1 and T2 reversed and the output eventually reaches the upper level. The points where the output reaches the upper and lower levels are the knees on the curves in FIG. 4. The $V_{id}$ values at these points are positive and negative one half of the input switching voltage, respectively. Since the ISV is only part of the input swing, the effective input transition time is that part of the input transition during which the input goes through the ISV. Thus, the effective transition time is less than the actual transition time as is shown in FIG. 5. As the output amplitude decreases and the ISV decreases, the effective transition time also decreases because the actual transition time remains constant.

As stated earlier, if the input transition has frequency components at which the circuit is underdamped, output overshoot occurs. This is the case for this circuit. As the amplitude decreases the effective transition time decreases which increases the frequency of the input components resulting in a more unstable circuit and more overshoot.

Figure 6:
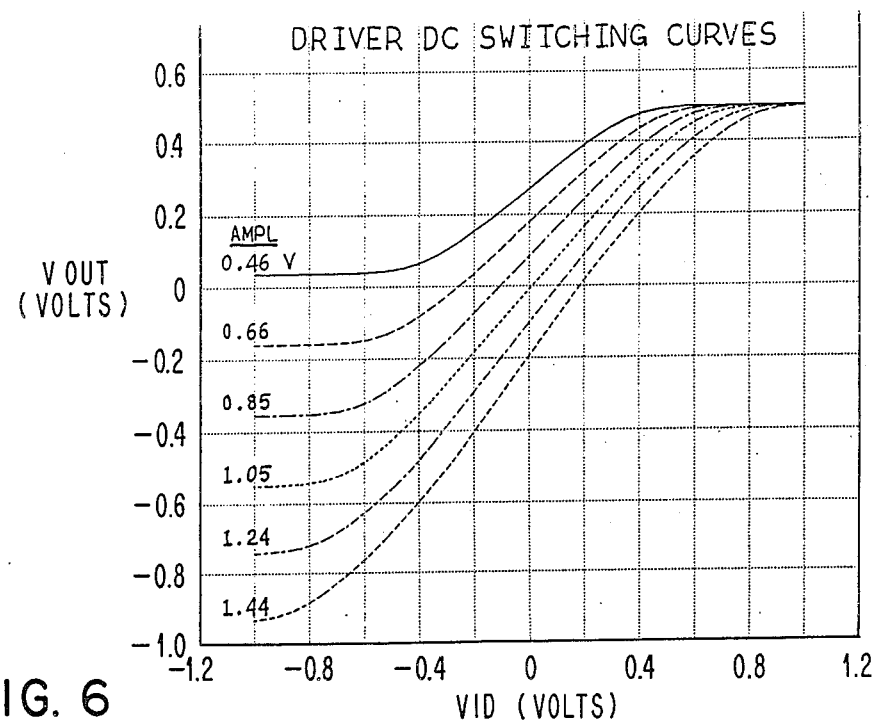
FIG. 6 is a plot of output voltage versus input difference voltage employed to illustrate DC switching curves for the driver circuit in accordance with the invention.
Figure 7:
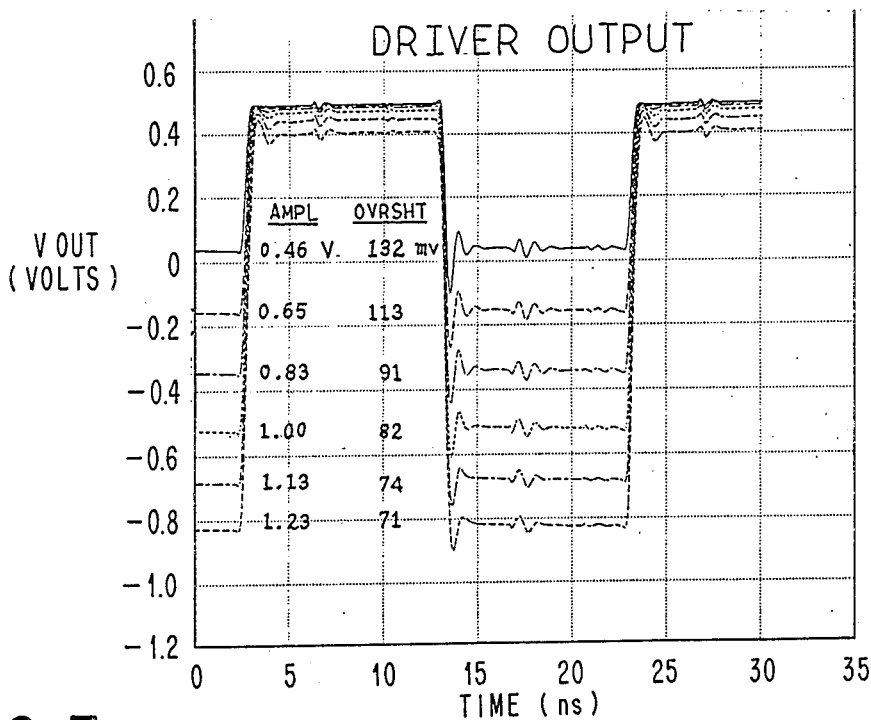
FIG. 7 discloses a number of plots of voltage versus time illustrating output voltage amplitude variations and overshoot for the driver circuit in accordance with the invention.

The overshoot problems are solved with two additions. First, Schottky diodes S1 and S2 are added in series with the emitters of driver switching pair. This increases the ISV because the diodes must also be switched on and off in addition to the transistors. FIG. 6 is a plot of the dc relationship of $V_{id}$ and the output voltage for the driver switching pair with diodes. Comparing these curves to those in FIG. 4 shows that the ISV has increased as stated above. This increase in ISV results in an increase in effective transition time which decreases the frequency of the input components and thus decreases overshoot relative to the circuit without diodes S1 and S2. As in FIG. 4, FIG. 6 shows a decrease in ISV as amplitude decreases. Because of this decrease, the circuit with diodes will also exhibit increasing overshoot with decreasing amplitude as explained above. FIG. 7 is a plot of the transient performance at six different amplitudes for the circuit with diodes. In comparison to FIG. 2, the transient performance for the circuit without diodes, FIG. 7 shows smaller overshoot which also increases as amplitude decreases as was predicted above.

The second addition is a predriver circuit whose output drives the driver circuit. The output amplitude of the predriver circuit is proportional to and varies with the driver output amplitude and is designed such that it is equal to the ISV of the driver circuit. The transition time of the predriver output is nearly independent of its amplitude and thus the effective driver input transition time is nearly constant for all driver output amplitudes. This constant effective transition time results in non varying frequencies of the input components which gives constant overshoot.

Figure 8:
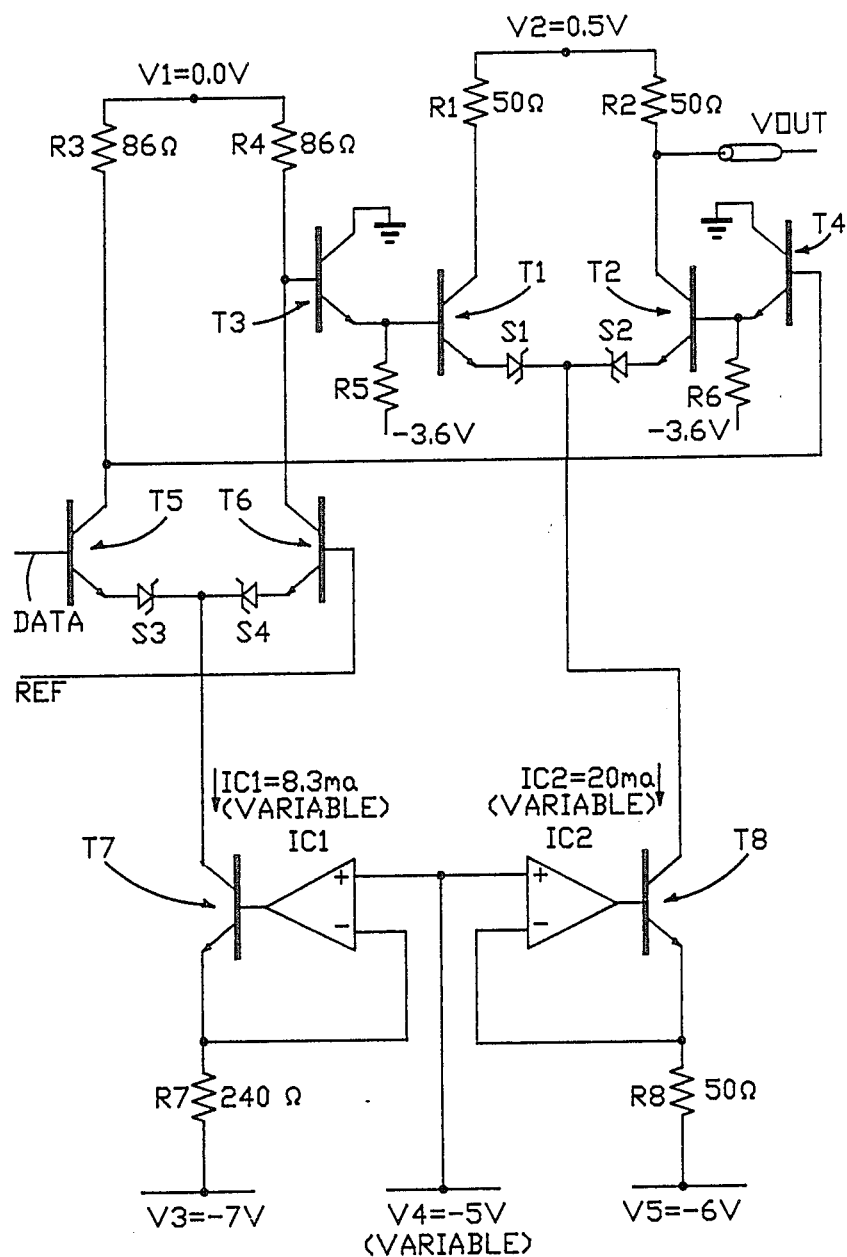
FIG. 8 discloses the circuit diagram of a driver circuit in accordance with the invention.

FIG. 8 shows the predriver/driver circuit in accordance with the invention. The driver includes the differential pair T1 and T2 with diodes S1 and S2 and collector resistors R1 and R2, and transistor current source T8 with emitter resistor R8 and controlled by operational amplifier IC2. The operational amplifier compensates for variations in the base to emitter voltage to keep the emitter and collector currents of T8 constant. The inverting input is forced to the voltage on the non-inverting input, V4, due to the high gain of the operational amplifier. If V4 is more positive than V5, a current is set in R8 and the base of T8 rises to establish the correct $V_{be}$ drop. The predriver circuit is similar to the driver circuit and consists of the differential pair T5 and T6 with diodes S3 and S4 and collector resistors R3 and R4, and transistor current source T7 with emitter resistor R7 and controlled by operational amplifier IC1. The predriver outputs are level shifted down by a $V_{be}$ drop by T3 and T4 so the driver output voltage can be shifted lower before saturating T1 and T2. The non-inverting inputs of the operational amplifiers are tied together so the driver input amplitude will track the driver output amplitude. The relationship between these amplitudes is derived below. (see FIG. 8)

$$I_c(T7) = (V_4 - V_3)/R7 \qquad \text{(Eq. 1)}$$

$$I_c(T8) = (V_4 - V_5)/R8 \qquad \text{(Eq. 2)}$$

assuming negligible base current. Solving Equation 2 for V4 and substituting into Equation 1 yields:

$$I_c(T7) = (R8/R7)I_c(T8) + (V_5 - V_3)/R7 \qquad \text{(Eq. 3)}$$

Driver input and output amplitudes are related to the current source currents by the following equations:

$$V_{in} = R_4 I_c(T7) \qquad \text{(Eq. 4)}$$

$$V_{out} = R_2 I_c(T8) \qquad \text{(Eq. 5)}$$

assuming negligible base current. Substituting Equations 4 and 5 into Equation 3 yields the relationship between driver input and output amplitudes.

$$V_{in} = (R_8 R_4 / R_7 R_2) V_{out} + (R_4/R_7)(V_5 - V_3) \qquad \text{(Eq. 6)}$$

Equation 6 shows a linear relationship such that the input amplitude decreases as the output amplitude decreases. This is the desired result since ISV decreases as output amplitude decreases and we want the predriver amplitude to be equal to the ISV.

The component values for the circuit are calculated by equating slope and intercept terms of Equation 6 with the gain and offset terms, respectively, of the $V_{in}(V_{out})$ relationship. This relationship is determined by measuring the ISV for each amplitude in FIG. 6 and then doing a least squares fit of ISV versus amplitude to find the best linear approximation.

Figure 9:
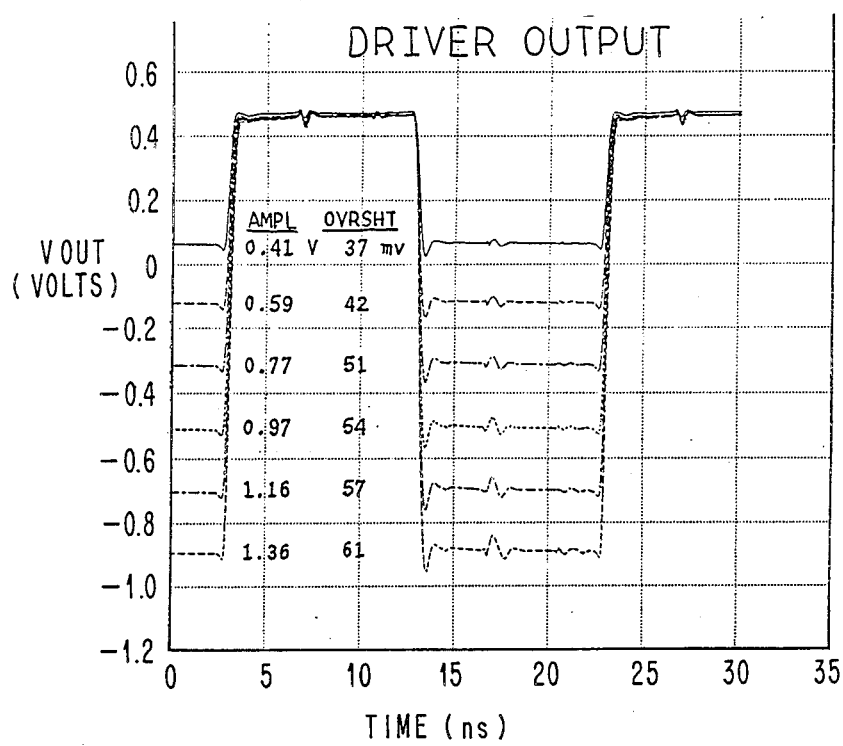
FIG. 9 discloses a number of plots of voltage versus time illustrating output voltage amplitude variations and overshoot for the driver circuit in accordance with the invention.

FIG. 9 shows the transient performance of the predriver/driver circuit at various amplitudes. In this case, overshoot is almost independent of amplitude which is the result of the input/output amplitude tracking.

SUMMARY OF STRUCTURAL AND FUNCTIONAL FEATURES OF THE SOLUTION

A. Schottky barrier diodes in common emitter node of driver increase the input switching voltage and thus decrease output overshoot.

B. Predriver used to vary amplitude of driver input such that input does not exceed switching voltage. This results in constant output overshoot independent of output amplitude.

C. Predriver and driver amplitude are controlled with same voltage. No additional control voltage needed.

D. Driver output overshoot is less than 65 mv and varies 24 mv over a 0.4 to 1.4 Volt amplitude range.

E. Driver output transition times are less than 400 ps.

F. Predriver circuit can also be used to change offset of driver input in order to increase output offset range.

G. The concept is applicable to any high speed differential pair switching circuit because it reduces overshoot without drastically affecting transition times.

Two examples are high speed pulse generators and high speed automated test equipment.

STRUCTURAL AND FUNCTIONAL DIFFERENCES BETWEEN PROPOSED SOLUTION AND EXISTING SOLUTION

A. Conventional driver is not switched differentially which results in slower transition times.

B. Proposed circuit is differentially switched to decrease transition times. Schottky barrier diodes are used in common emitter node of driver to reduce overshoot caused by faster transition times.

C. Driver input amplitude is varied in proportion to output amplitude in proposed circuit to reduce output overshoot variation which was caused by fixed input amplitude and faster transition times.

While the invention has been particularly shown and described with reference to a preferred embodiment thereof, it will be understood by those skilled in the art that numerous changes in form and detail may be made therein without departing from the spirit and scope of the invention.

What is claimed is:

1. A driver circuit wherein said driver circuit comprises:
    first, second, third, fourth, fifth, sixth, seventh and eighth transistors, said first through eighth transistors each having an emitter, base and collector, said collector of said fifth transistor connected to said base of said fourth transistor, said collector of said sixth transistor connected to said base of said third transistor, said base of said sixth transistor connected to a source of reference potential;
    an input terminal for accepting a binary digital input, said input terminal connected to said base of said fifth transistor, said emitter of said third transistor connected to said base of said first transistor, said collector of said third transistor connected to a sixth source of potential, said emitter of said fourth transistor connected to said base of said second transistor, and said collector of said fourth transistor connected to said sixth source of potential;
    a first diode connected between said emitter of said first transistor and said collector of said eighth transistor;
    a second diode connected between said emitter of said fifth transistor and said collector of said eighth transistor;
    a third diode connected between said emitter of said fifth transistor and said collector of said seventh transistor;
    a fourth diode connected between said emitter of said sixth transistor and said collector of said seventh transistor;
    a first resistor connected between said collector of said first transistor and a second source of potential;
    a second resistor connected between said collector of said second transistor and said second source of potential;
    a third resistor connected between said collector of said fifth transistor and a first source of potential;
    a fourth resistor connected between said collector of said sixth transistor and said first source of potential;
    a fifth resistor connected between said emitter of said third transistor and a seventh source of potential;
    a sixth resistor connected between said emitter of said fourth transistor and said seventh source of potential;
    a seventh resistor connected between said emitter of said seventh transistor and a third source of potential;
    an eighth resistor connected between said emitter of said eighth transistor and a fifth source of potential;
    operational amplifier circuit means interconnecting said base of said seventh transistor, said base of said eighth transistor, said emitter of said seventh transistor, said emitter of said eighth transistor and a fourth source of potential; and,
    an output terminal, said output terminal connected to the collector of said second transistor.

2. A driver circuit as recited in claim 1, wherein,
    said first diode is a Schottky diode having an anode and a cathode, said anode of said first Schottky diode connected to said emitter of said first transistor and said cathode of said first Schottky diode connected to said collector of said eighth transistor,
    said second diode is a Schottky diode having an anode and a cathode, said anode of said second Schottky diode connected to said emitter of said second transistor and said cathode of said second Schottky diode connected to said collector of said eighth transistor,
    said third diode is a Schottky diode having an anode and a cathode, said anode of said third Schottky diode connected to said emitter of said fifth transistor and said cathode of said third Schottky diode connected to said collector of said seventh transistor, and
    said fourth diode is a Schottky diode having an anode and a cathode, said anode of said fourth Schottky diode connected to said emitter of said sixth transistor and said cathode of said fourth Schottky diode connected to said collector of said seventh transistor.

3. A driver circuit as recited in claim 2, wherein said operational amplifier circuit means including,
    first and second operational amplifiers, said first and second operational amplifiers each having a first input, a second input and an output, said first input of said first operational amplifier connected to said emitter of said seventh transistor, said first input of said second operational amplifier connected to said emitter of said eighth transistor, said second input of said first operational amplifier and said second input of said second operational amplifier connected in common to said fourth source of potential, said output of said first operational amplifier connected to said base of said seventh transistor, and said output of said second operational amplifier connected to said base of said eighth transistor.

* * * * *